(12) United States Patent
Yang et al.

(10) Patent No.: US 10,978,295 B2
(45) Date of Patent: Apr. 13, 2021

(54) EPITAXIAL GROWTH ON SEMICONDUCTOR STRUCTURES

(71) Applicant: Micron Technology, Inc., Boise, ID (US)

(72) Inventors: Guangjun Yang, Meridian, ID (US); Nicholas R. Tapias, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/445,507

(22) Filed: Jun. 19, 2019

(65) Prior Publication Data

US 2020/0402798 A1  Dec. 24, 2020

(51) Int. Cl.
*H01L 27/105* (2006.01)
*H01L 27/22* (2006.01)
*H01L 21/02* (2006.01)
*G11C 5/06* (2006.01)
*H01L 27/24* (2006.01)

(52) U.S. Cl.
CPC ........ *H01L 21/02532* (2013.01); *G11C 5/063* (2013.01); *H01L 27/105* (2013.01); *H01L 27/222* (2013.01); *H01L 27/24* (2013.01)

(58) Field of Classification Search
CPC ................. H01L 27/10876; H01L 27/105
USPC .................................................. 257/616, 773
See application file for complete search history.

(56) References Cited

U.S. PATENT DOCUMENTS

| | | | |
|---|---|---|---|
| 7,662,693 B2 | 2/2010 | Bhattacharyya | |
| 7,875,529 B2 | 1/2011 | Forbes et al. | |
| 8,274,777 B2 | 9/2012 | Kiehlbauch | |
| 2014/0175659 A1* | 6/2014 | Lee | H01L 21/7682 257/773 |
| 2014/0179102 A1* | 6/2014 | Joung | H01L 21/76897 438/666 |
| 2015/0014759 A1* | 1/2015 | Lee | H01L 23/53266 257/306 |
| 2017/0005166 A1* | 1/2017 | Park | H01L 27/10888 |

\* cited by examiner

*Primary Examiner* — David Vu
*Assistant Examiner* — Brandon C Fox
(74) *Attorney, Agent, or Firm* — Brooks, Cameron & Huebsch, PLLC

(57) ABSTRACT

Systems, apparatuses, and methods related to epitaxial growth on semiconductor structures are described. An apparatus may include a working surface of a substrate material and a storage node connected to an active area of an access device on the working surface. The apparatus may also include a material epitaxially grown over the storage node contact to enclose a non-solid space between the storage node contact and passing sense lines.

20 Claims, 5 Drawing Sheets

EPITAXIAL GROWTH ON SEMICONDUCTOR STRUCTURES

TECHNICAL FIELD

The present disclosure relates generally to semiconductor devices and methods, and more particularly to epitaxial growth on semiconductor structures.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
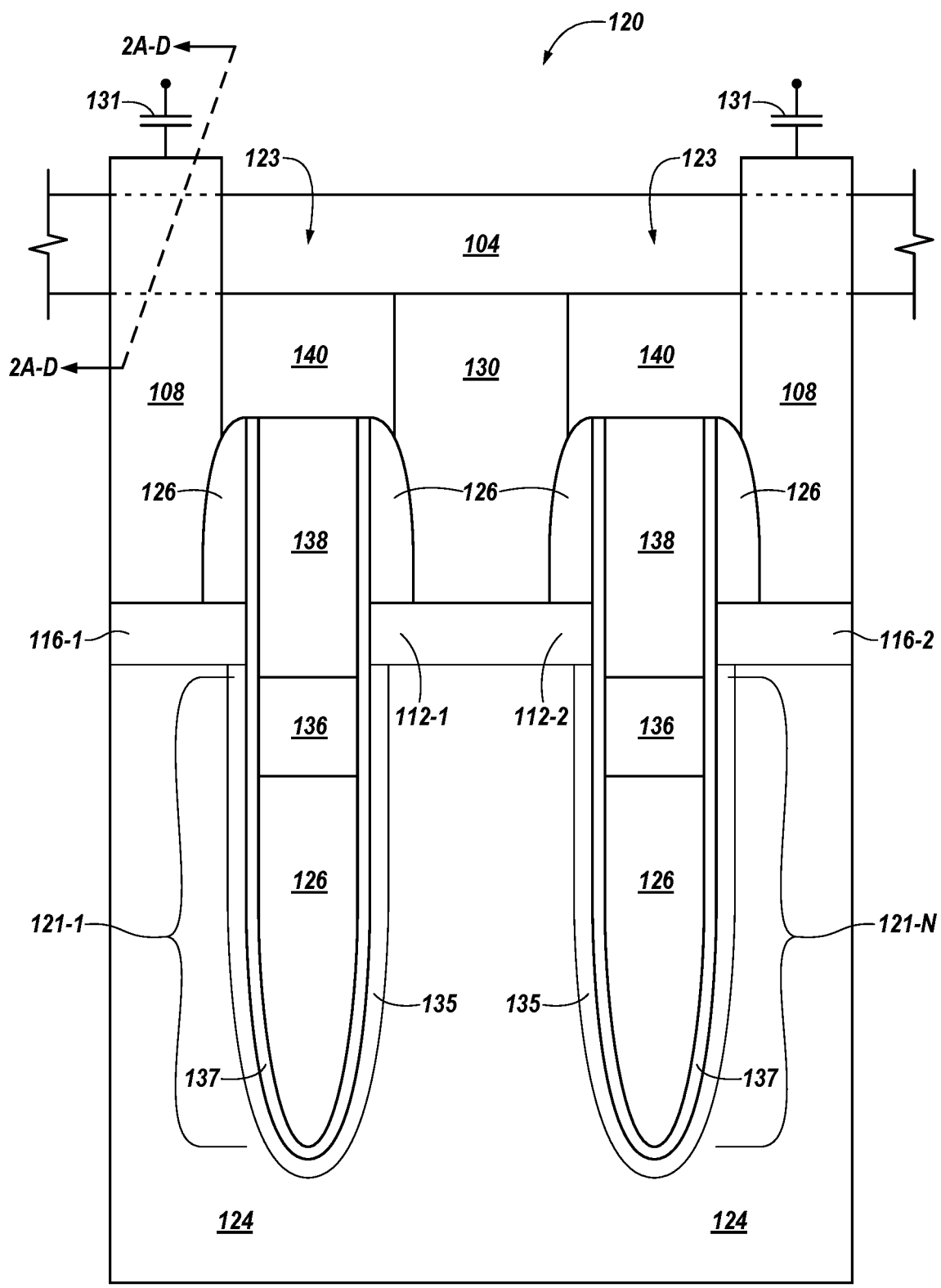
FIG. 1 illustrates an example cross-sectional side view of a memory cell in accordance with a number of embodiments of the present disclosure.

Various types of memory devices, including arrays of volatile and/or non-volatile memory cells (e.g., a memory array), are disclosed having epitaxially grown material on semiconductor structures, e.g., storage node contacts. For example, according to a particular design rule an epitaxially grown material may be grown on a storage node contact to a height in a range of 20-50 nanometers (nm) to enclose a non-solid space between the storage node contact and neighboring, passing sense lines. With shrinking design rules, decreasing capacitive coupling between conductive components while protecting underlying materials in subsequent semiconductor processing steps is increasingly relevant. For example, having a low dielectric constant (k) material separating conductive components is beneficial. Example embodiments disclose an epitaxially grown material sealing a non-solid space between a conductive storage node contact and an adjacent, passing sense line to provide improved isolation than that attained by a solid low k dielectric material and may also be relevant to preventing dielectric damage and to cell leakage control. As the physical size of memory devices decreases, dielectric leakage control becomes increasingly difficult. Epitaxially grown material on a semiconductor structure in the present disclosure may serve to reduce dielectric leakage.

In some embodiments, the epitaxially grown material may be Silicon (Si). While examples in the present disclosure discuss epitaxially growing Si, embodiments are not so limited and may include other epitaxially grown materials. In the example of Si, the Si may be grown over a storage node contact, and in some instances, seal a non-solid space adjacent to the storage node contact.

Fabrication of semiconductor structures, such as storage nodes of a memory device, may involve flowing etchants as the material is being formed in a vacuum environment, e.g. "in-situ," to control formation according to a particular semiconductor fabrication sequence. The etchant may affect some characteristics of the material being grown. Therefore, characteristics of the material may be intentionally adjusted by adjusting the amount of etchant flowed with depositing the material in-situ.

Memory devices may include dielectric materials that serve as insulators of a storage node. For example, in certain architectures, a storage node contact may comprise a conductive material that is 20 nm wide. Capacitive coupling between conductive components may exist and damage to a dielectric material may occur in subsequent processing steps in a semiconductor fabrication process as the design rules shrink, thus leading to the chance of voltage leakage from the storage node. Capacitive coupling may result in inaccurate reads of a signal, e.g., charge, stored on a storage node.

Various embodiments of the present disclosure include epitaxially growing a material in a semiconductor fabrication sequence. The material may be grown to decrease capacitive coupling between conductive components while protecting an underlying isolation space of non-solid material. According to embodiments, the isolation space (also referred to herein as and "isolation area" and "isolation region") is a non-solid space. In some embodiments, the non-solid space may separate a storage node contact from a passing sense line. The epitaxially grown material may be grown to a width that seals the non-solid space from subsequent processing steps, such as subsequent deposition steps, and act as a barrier between the non-solid space and subsequent semiconductor fabrication processes. In one example, just by way of illustration and not by way of limitation, the epitaxially grown material may be Silicon (Si). In another embodiment, the epitaxial grown material may be Germanium (Ge).

Additionally, or alternatively, shrinking design rules may result in components of semiconductors being formed closer together. And, as design rules shrink, damage to earlier formed structures and materials in subsequent processing steps may become more possible. For example, an adjacent dielectric material damaged in a subsequent processing step may lead to signal, e.g., charge, leakage issues. The issues with protecting integrity of materials and components together with the proximity of the semiconductor components, as well as the decrease in the size of dielectrics to comport with the shrinking design rules, may increase the instances of voltage leaking through a dielectric material. This leakage may cause a weaker signal, e.g., charge, to be maintained or detectable on a storage node and may result in negative effects, such as, inaccurate reads, short circuits, etc. Epitaxially growing a material as described herein may decrease capacitive coupling between conductive components while reducing such damage and may also reduce, or even eliminate, the leakage caused in part by the shrinking design rules. As used herein, the term damage to a dielectric material refers to materials from subsequent processing steps filling in some or all of the non-solid space serving as a dielectric. In some embodiments, the epitaxially grown material may serve as a barrier between the non-solid space and the materials from the subsequent semiconductor fabrication processes. As such, subsequent semiconductor fabrication processes may occur without damaging the dielectric space, e.g. non-solid space, underlying the epitaxially grown material. This may decrease capacitive coupling between conductive components.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something may refer to one or more such things. For example, a number of passing sense lines may refer to at least one passing sense line.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 102-1 may reference element 02-1 in FIGS. 1 and 102-2 may reference element 02-2, which may be analogous to element 102-1. Such analogous elements may be generally referenced without the hyphen and extra numeral or letter. For example, elements 102-1 and 102-2 or other analogous elements may be generally referenced as 102.

FIG. 1 illustrates a cross-sectional view of an apparatus 120 showing a pair of neighboring memory cells sharing a source/drain region, e.g., 112-1 and 112-2, and a sense line contact 130 connecting to a passing sense line 104. The pair of neighboring memory cells include access devices 123 coupled to storage node contacts 108 and storage nodes 131 in accordance with a number of embodiments of the present disclosure. According to some embodiments, the memory cells include semiconductor structures having epitaxially grown material formed in accordance with the techniques described herein. For example, the storage node contacts 108 may include epitaxially grown material formed in accordance with the techniques described herein.

The access devices 123 include gates 121-1, . . . , 121-N, individually or collectively referred to as gate 121. The gate 121 may also be referred to as a gate electrode. The access devices 123 may include a recessed access device, e.g., a buried recessed access device (BRAD). In the example shown, the gate 121 may include a first portion 126 including a metal containing material, e.g., titanium nitride (TiN), and a second portion 136 including a doped polysilicon to form a hybrid metal gate (HMG) 121. The gate 121 may be separated from a channel 135 by a gate dielectric 137. The gate 121 separates a first source/drain region 116-1 and 116-2, collectively referred to as first source/drain region 116, and a second source/drain region 112-1 and 112-2, collectively referred to as second source/drain region 112. In the example of FIG. 1, two neighboring access devices 123 are shown sharing a second source/drain region 112 at a junction. The neighboring access devices 123 may be formed on a working surface of a semiconductor material on a substrate 124.

In the example of FIG. 1, a storage node 131 (shown schematically for ease of illustration) is connected to a storage node contact 108 formed in accordance with the techniques described herein. The storage node contact 108 may be connected to an active area, e.g., a first source/drain region 116 of an access device 123. An insulation material 140 (e.g., a dielectric material) may be formed on the spacer material 126 and the gate mask material 138, and in contact with a conductive material 130 serving as a sense line contact 130. The sense line contact 130 may be connected to a sense line 104, e.g., passing sense line orthogonal to a directional orientation of access lines connecting to gates 121 of the access devices 123. In the example illustration of FIG. 1, the illustrated passing sense line 104 is actually recessed into the page, parallel to the plane of the drawing sheet so as to be offset a particular depth from the storage nodes 131. Access lines connected to gates 121 may be running perpendicular to a plane of the drawing sheet, e.g., coming out of the page.

In some embodiments the sense line contact 130 may be a metallic material, e.g., Tungsten (W). The insulation material 140 may be formed on the spacer material 126 and the gate mask material 138, and in contact with the conductive sense line material 130.

FIGS. 2A-2D illustrate example cross-sectional views, taken along cut-line 2A-D of FIG. 1, showing an example of epitaxially growing a material on a semiconductor structure in an example semiconductor fabrication process in accordance with a number of embodiments of the present disclosure. The semiconductor fabrication process illustrated in FIGS. 2A-2D is shown at particular points in time that correspond to particular processing activities being performed in the semiconductor fabrication process. Other processing activities included in a particular semiconductor fabrication sequence may be omitted for ease of illustration.

Figure 2A:
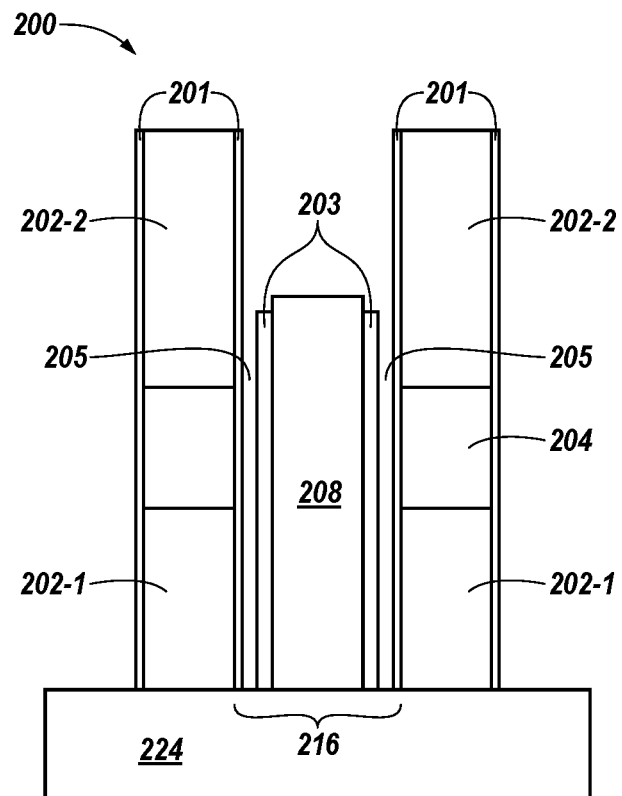
FIGS. 2A-2D illustrate example cross-sectional views of an epitaxial growth on a semiconductor structure in accordance with a number of embodiments of the present disclosure.

FIG. 2A illustrates a semiconductor structure during a semiconductor fabrication process at point in time 200. In the illustration of FIG. 2A, passing sense lines 204 are shown perpendicular to the plane of the drawing sheet. According to this example architecture, the passing sense lines 204 are embedded in a semiconductor fabrication support structure. For example, FIG. 2A, shows a first portion of a passing sense line support structure material 202-1, the conductive, passing sense line 204, and a second portion, e.g., cap, to the passing sense line support structure 202-2, and dielectric material 201 deposited along sidewalls to the passing sense lines 204 and passing sense line support structures 202. In some embodiments, the sense line support structure material 202 may be Nitride (Ni). In some embodiments, the conductive, passing sense lines 204 may comprise a metallic composition including Tungsten (W).

The example embodiment of FIG. 2A, illustrates a storage node contact 208 connected to an active area, e.g., first source/drain region 216, on a working surface of a semiconductor substrate 224. In the example of FIG. 2A, a dielectric material 203 has been formed along sidewalls of the storage node contact 208. In some embodiments, the dielectric material 201 and 203 may be deposited over the passing sense lines 204 and passing sense line support structure 202 and over the storage node contact 208 as one conformal deposition layer and then patterned and etched to remove the dielectric material from between the passing sense lines 204 and the storage node contact 208 and separate the dielectric the dielectric materials 201 and 203 to respective sidewalls to create the non-solid space between the passing sense lines 204 and the storage node contact 208. In some embodiments, the dielectric material 203 is recessed to a lower height (h) than a height (H) of the storage node contact 208. According to embodiments, a non-solid space 205 is present and separates the dielectric material 201 on sidewalls of the passing sense lines 204 and the dielectric material 203 on sidewalls of the storage node contact 208.

In some embodiments, forming the non-solid space 205 may include forming a sacrificial material (not pictured). The sacrificial material may be an insulator material formed between the passing sense lines 204 and the storage node contact 208. In some embodiments, the sacrificial material may be formed from silicon dioxide ($SiO_2$). In some embodiments, the sacrificial material may be removed using a selective etch. In some embodiments, removing the sacrificial material with a selective etch may complete the formation of the non-solid space 205.

The non-solid space 205 may act as a low dielectric constant (k) insulator area between the passing sense lines 204 and the storage node contact 208. In some embodiments, the passing sense lines 204 and the storage node contact 208 and the dielectric materials 201 and 203 may be formed in-situ. For example, the passing sense lines 204 and the storage node contact 208 and dielectric materials 201 and 203 may be formed and recessed in a processing apparatus, e.g., in a vacuum chamber. The dielectric constant (k) of a vacuum is approximately 1.0. Therefore, if no other substance traveled into the non-solid space 205, the k of non-solid space 205 may be 1.0. If another substance has traveled into the non-solid space 205, e.g., other gas atoms are present, the k of the non-solid space 205 may be affected.

Figure 2B:
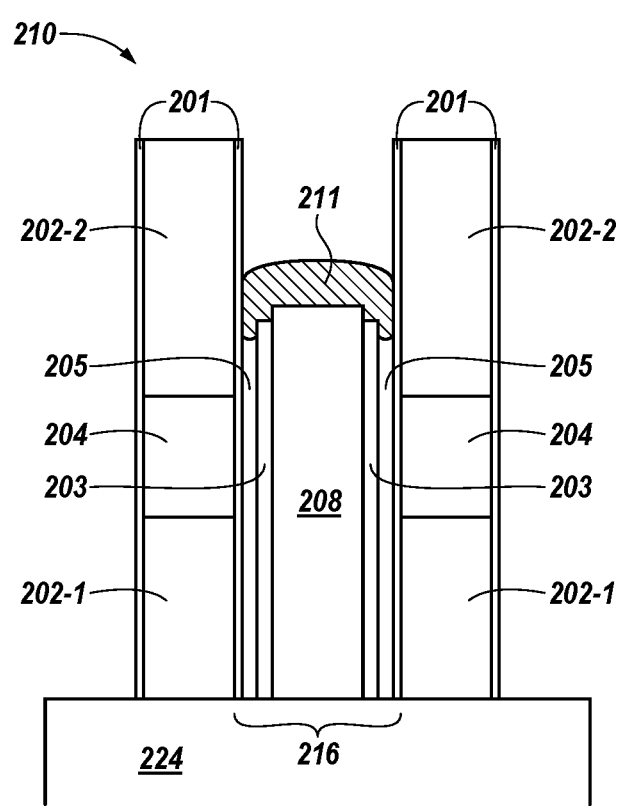

FIG. 2B illustrates epitaxially growing a material on a semiconductor structure during a semiconductor fabrication process at another point in time 210 in the semiconductor fabrication process. As shown in FIG. 2, a material 211 has been epitaxially grown on the storage node contact 208. In some embodiments, the material 211 can be selectively, epitaxially grown. In some embodiments, the material will selectively, epitaxially grown on the exposed polysilicon surfaces. In some embodiments, the epitaxially grown material 211 may be Si. In some embodiments, the epitaxially grown material 211 may be Germanium (Ge).

The epitaxially grown material 211 may be grown on the storage node contact 208 from a polycrystalline material. For example, in some embodiments, the storage node contact 208 may be poly silicon. Polysilicon is a polycrystalline material. A polycrystalline material is a material consisting of many crystalline parts that are more randomly oriented with respect to each other than a monocrystalline atomic lattice structure. Polycrystalline materials consist of multiple crystals and can be recognized by a visible grain. This differs from monocrystalline materials that consist of a homogenous crystalline framework. Monocrystalline material has a single, continuous and unbroken crystal as its structure contains no grain boundary.

In some embodiments, the epitaxially grown material 211 may be grown on polysilicon by flowing a silicon containing precursor gas in a processing apparatus across the working surface, e.g., storage node contact 208. Examples of a silicon containing precursor gas include Silane ($SiH_4$), Dichlorosilane ($SiCl_2H_2$), Disilane ($Si_2H_6$), and Trisilane ($Si_3H_8$). In some embodiments the silicon containing precursor gas may be flowed into the processing apparatus with an etchant gas for selectively tuning the epitaxial growth. Examples of an etchant gas include Hydrogen Chloride (HCl) and Dichlorine ($Cl_2$). In some embodiments the silicon containing precursor gas may be flowed into the processing apparatus with a buffer gas for controlling an epitaxial growth rate. Examples of a buffer gas may include Nitrogen (N), Argon (Ar), etc. Embodiments, however, are not limited to Nitrogen (N) and Argon (Ar) as example buffer gases.

In some embodiments, dopants may be flowed into the processing apparatus with the silicon containing precursor gas to achieve a particular conductive property to the epitaxially grown material 211. Examples of particular dopants may include Diborane ($B_2H_6$), Boron trichloride ($BCl_3$), Phosphine ($PH_3$), Arsine ($AsH_3$), etc. In some embodiments the epitaxially grown material may be Ge. In some embodiments, a non-limiting example of the precursor used to grow the Ge may be Germane ($GeH_4$). In some embodiments the silicon containing precursor gas may be flowed into the processing apparatus at a pressure range from five (5) Torr to approximately 600 Torr (T). In some embodiments the silicon containing precursor gas may be flowed into the processing apparatus at a temperature range from 400 degrees Celsius (° C.) to 1,150 degrees C. In one example embodiment, the silicon containing precursor gas may be flowed into the processing apparatus at a temperature range from 600 degrees ° C. to 800 degrees ° C. In some embodiments, the concentration of the dopants may range from undoped to as high as approximately $2 \times e^{21}$ per square centimeter ($/cm^2$).

According to some embodiments, epitaxially growing the material 211 on polysilicon may result in the epitaxially grown material 211 growing in both a perpendicular and parallel direction to a top surface of the storage node contact 208. In some embodiments, having the dielectric material 203 recessed to a lower height (h) than a height (H) of the storage node contact 208 facilitates epitaxially growing the material 211 on the polysilicon in an omnidirectional manner. As used herein, omnidirectional refers to the epitaxially grown material growing in multiple directions without the growth being directed in a clearly discernable direction. This may differ from the growth that may result from epitaxially growing a material on a monocrystalline structure. Epitaxially growing a material on a monocrystalline structure may result in a growth that is more oriented in a single direction.

In some embodiments, etchants may be flowed with the precursor while epitaxially growing material 211 in-situ. Flowing etchants in gaseous form while epitaxially growing material 211 may affect the growth of the epitaxially grown material 211. For example, flowing an etchant into the epitaxially grown material 211 in-situ may affect the selectivity of the epitaxially grown material 211. As mentioned, in some embodiments, the epitaxially grown material 211 may be Si. When Si deposits on a non-Si material, the Si may form nuclei dispersed across the surface of the non-Si material. Flowing etchants into the epitaxially grown material 211 may remove those nuclei as they form. This may prevent the growth of the epitaxially grown material 211 on any material other than Si. Therefore, flowing etchants in gaseous form while epitaxially growing material 211 may increase the selectivity of the epitaxially grown material 211 and result in the epitaxially material 211 selectively growing on one material. In some embodiments, that material may be Si.

In some embodiments, the epitaxially grown material 211 may be grown to encompass a width of the non-solid space 205. In some embodiments, the non-solid space 205 may encompass a width in a range of 30-50 Angstroms (Å). By growing to encompass the width of the non-solid space 205, the epitaxially grown material 211 may seal the non-solid space 205. By sealing the non-solid space 205, the epitaxially grown material 211 may protect the non-solid space from the effects of subsequent semiconductor fabrication processing within the processing apparatus or to the semiconductor structure. This may allow for subsequent semiconductor fabrication processes to be performed on the semiconductor structure without having materials from the subsequent semiconductor fabrication processes being deposited into the non-solid space 205 and affecting the dielectric constant (k) of the non-solid space 205.

Figure 2C:
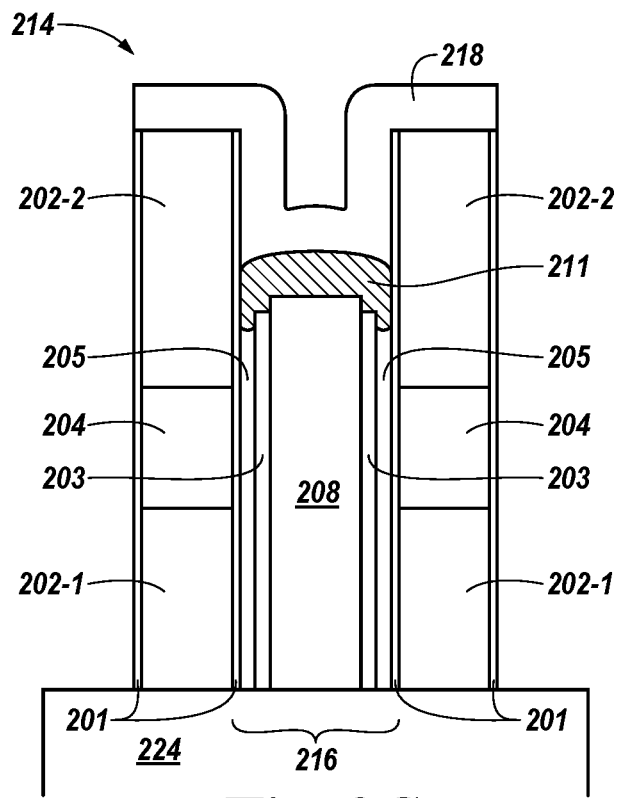

FIG. 2C illustrates a semiconductor structure during a semiconductor fabrication process at another point in time 214 in the semiconductor fabrication process. As shown in FIG. 2C, a dielectric material 218 may be deposited over the passing sense lines 204, the storage node contact 208, and the epitaxially grown material 211. In some embodiments, the dielectric material 218 may be Nitrogen (N). Embodiments, however, are not limited to the example of Ni.

As shown in FIG. 2C, the epitaxially grown material 211 may protect the non-solid space 205 from subsequent processes in a semiconductor fabrication process. In some embodiments, the epitaxially grown material 211 may grow to encompass the width of the non-solid space 205 and form a seal for the non-solid space 205. In some embodiments, a subsequent process may include depositing a layer of dielectric material 218. The epitaxially grown material 211 may prevent the dielectric material 218 from entering the non-solid space 205.

Figure 2D:
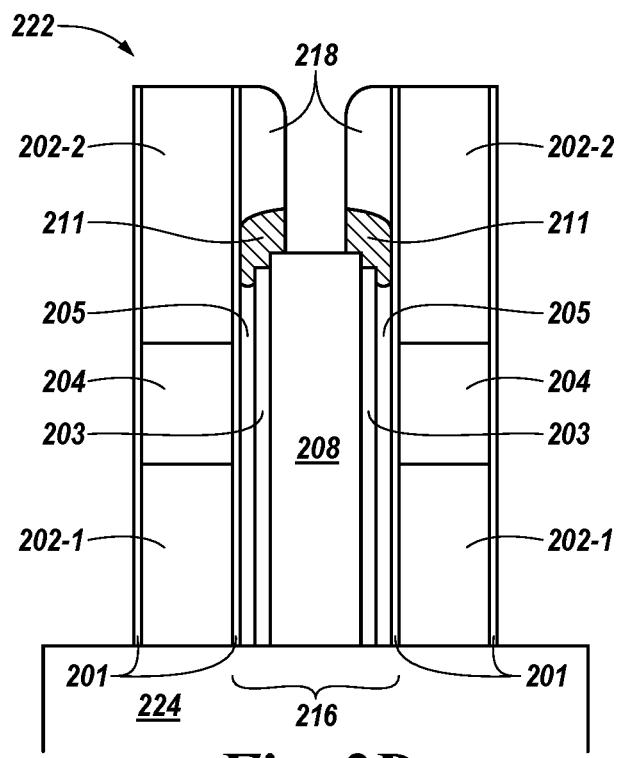

FIG. 2D illustrates a semiconductor structure during a semiconductor process at another point in time 222 in the fabrication process. As shown in FIG. 2D, portions of the dielectric material 218 and the epitaxially grown material 211 may have been removed.

As shown in FIG. 2D, the storage node contact 208 may be exposed after portions of the dielectric material 218 and the epitaxially grown material 211 have been removed. Portions of the dielectric material 218 and the epitaxially grown material 211 may be removed by an etching process. An etching process may damage the storage node contact 208. The dielectric material 218 and the epitaxially grown material 211 may protect the storage node contact 208 from being damaged during an etching process. Exposing a portion of the storage node contact 208 may allow for a storage node to be formed over the storage node contact 208 according to subsequent semiconductor processing techniques.

Figure 3:
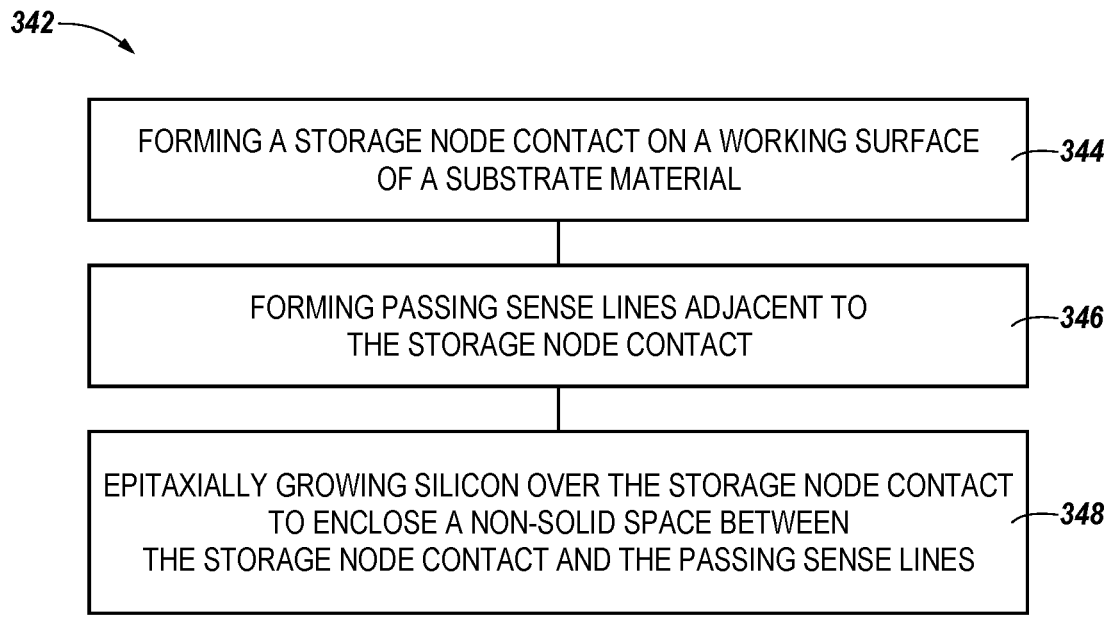
FIG. 3 is a flow diagram of an example method for epitaxial growth on a semiconductor structure in accordance with a number of embodiments of the present disclosure.

FIG. 3 is a flow diagram of an example method for epitaxial growth on a semiconductor structure in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 344, the method 342 may include forming a storage node contact on a working surface of a substrate material. In some embodiments, the storage node contact may be formed to a width in a range of 10-30 nm wide. In some embodiments, the storage node contact may be formed to width of approximately 20 nm. In some embodiments, the storage node contact may be formed out of polysilicon. A dielectric material may be formed on the sides of the storage node contact. In some embodiments, the dielectric material may be N.

In some embodiments, the storage node contact may be formed to a height that is greater than the height of the dielectric material formed on the sides of the storage node contact. This may facilitate the anisotropic (or multi-directional) growth of an epitaxially grown material, e.g. epitaxially grown material 211 shown in FIG. 2B. In some embodiments the epitaxially grown material may be selectively grown on Si. Forming the storage node contact to a height that is greater than the height of the dielectric material may result in more Si, e.g. polysilicon, being available to facilitate lateral growth of the epitaxially grown material.

In some embodiments, the storage node contact may be formed to a height that is above a top portion of a conductive portion of a passing sense line, e.g. passing sense line 204 shown in FIG. 2A. The storage node contact may be formed to a height in a range of 20-25 nm above the top portion of the conductive portion of a passing sense line. In some embodiments, the storage node contact, e.g. storage node contact 208 in FIG. 2A, may be formed to a height that is below the top portion of the metal portion of the passing sense line.

At block 346, the method 342 may include forming passing sense lines adjacent to the storage node contact. The passing sense lines may include a dielectric portion and a conductive portion. In some embodiments, the passing sense lines may have multiple dielectric portions. In some embodiments, the different dielectric portions of the passing sense lines may be formed from different dielectric materials. In some embodiments, a number of the dielectric portions may be N. The dielectric material may be formed on the sides of the of the passing sense lines.

At block 348, the method 342 may include epitaxially growing conductive material, e.g. Si, over the storage node contact to enclose a non-solid space between the storage node contact and the passing sense lines. The conductive material may be Si, Ge, etc. In some embodiments, Si is epitaxially grown on the storage node, e.g. semiconductor material, in-situ. Precursors (gasses) inside of the vacuum chamber may be used to epitaxially grow the Si. In some embodiments, the precursors used to grow the Si may include, but are not limited to, Silane ($SiH_4$), Dichlorosilane ($SiCl_2H_2$), Disilane ($Si_2H_6$), and Trisilane ($Si_3H_8$). In some embodiments the epitaxially grown material may be Ge. In some embodiments, a non-limiting example of the precursor used to grow the Ge may be Germane ($GeH_4$). In some embodiments, the temperature inside the vacuum chamber during epitaxy may be 400-1150 degrees Celsius.

In some embodiments, etchants may be flowed in-situ in gaseous form while epitaxially growing Si, etc. In some embodiments, the etchants may include, but are not limited to, Hydrogen Chloride (HCl) and Dichlorine ($Cl_2$). Flowing etchants into the Si during epitaxial growth may affect the growth of the Si. In some embodiments, the selectivity of the Si may be increased by increasing a flow of etchants into the Si in-situ. As used herein, the term "selectivity" refers to a material's ability to attach to certain materials while not attaching to other materials. In some embodiments, the Si may be selectively grown to attach to Si materials, e.g. polysilicon. When Si grows on a non-Si material, the Si may form nuclei that are dispersed across the surface of the non-Si material. In some embodiments, the etchant may remove these nuclei to impede the Si from growing on any non-Si material. In some embodiments, the selectivity of the Si may be decreased by decreasing the flow of etchant into the Si in-situ.

The rate of the epitaxial growth of the Si may be affected by the amount of etchant deposited into the Si. In some embodiments, the rate of epitaxial growth of the Si may decrease when the amount of etchant deposited into the Si is increased. In some embodiments, the rate of epitaxial growth may increase when the amount of etchant deposited into the Si is decreased. The size of the epitaxially grown Si may also be affected by depositing the etchant. In some embodiments, increasing the amount etchant deposited into the Si may decrease a grain size of the Si and be used to control a height (h) and a width (w) of the epitaxially grown material. In some embodiments, decreasing the amount of etchant deposited into the Si may increase a grain size of the Si.

In some embodiments, the Si is pseudo epitaxially grown over a polysilicon storage node contact. As used herein, the term "pseudo epitaxial growth" may refer to epitaxially growing a material on polysilicon. The term pseudo epitaxial growth is used because the term epitaxial growth is generally used to refer to epitaxially growing a material on a monocrystalline structure. In some embodiments, the Si may be epitaxially grown on a polycrystalline structure. In some embodiments, the polycrystalline structure may be polysilicon.

Figure 4:
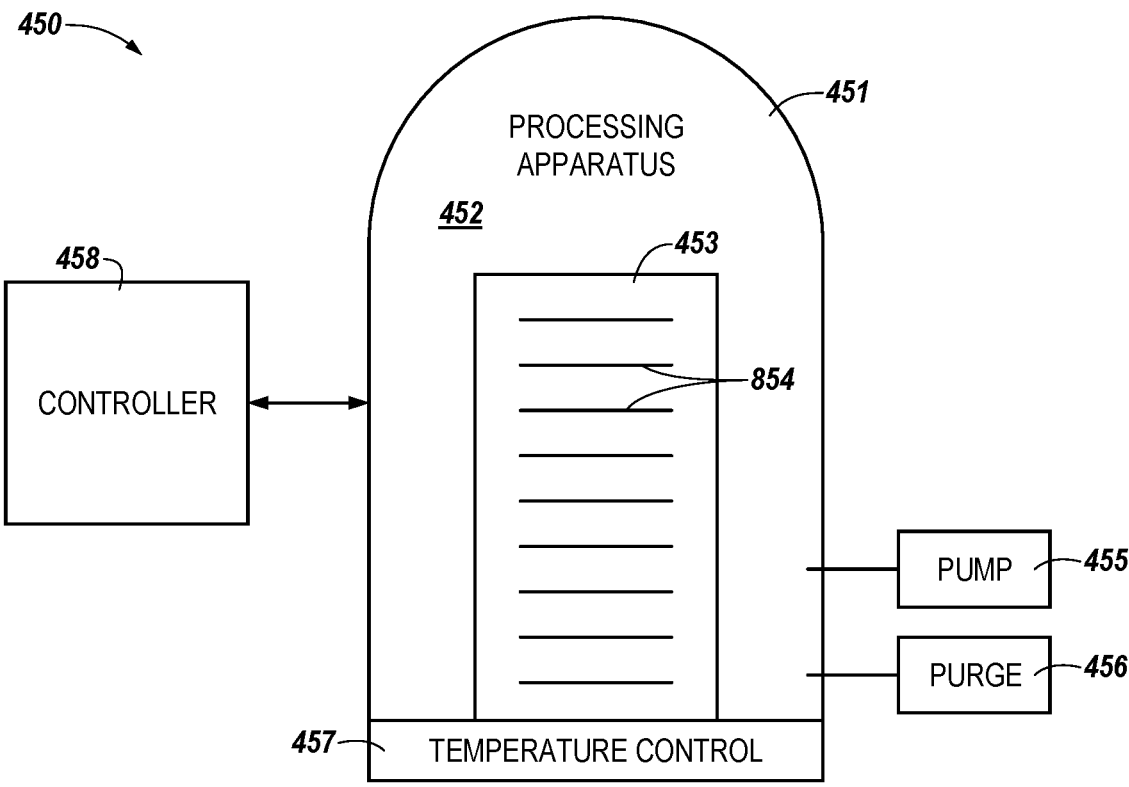
FIG. 4 is a functional block diagram of a system for implementation of an example semiconductor fabrication process in accordance with a number of embodiments of the present disclosure.

FIG. 4 is a functional block diagram of a system 450 for implementation of an example semiconductor fabrication process in accordance with a number of embodiments of the present disclosure. The numbering convention used in connection with FIG. 4 does not follow the earlier introduced numbering convention and sequence that applies to FIGS. 1-3. The system 450 may include a processing apparatus 451. The processing apparatus 451 may be configured to enable formation of structural materials on and/or removal of structural materials from a semiconductor device during fabrication of the semiconductor device.

FIG. 4 illustrates an example processing apparatus 451 that may be used in a semiconductor fabrication process. The processing apparatus 451 may include a chamber 452 to enclose components configured to perform deposition and/or etch operations on a number of semiconductor devices. The chamber 452 may further enclose a carrier 453 to hold a batch of semiconductor wafers 454. The processing apparatus 451 may include and/or be associated with tools including, for example, a pump 455 unit and a purge 456 unit configured to introduce and remove appropriate etch chemistries, as described herein, at each point in the semiconductor fabrication sequence. The processing apparatus 451 may further include a temperature control 457 unit configured to maintain the chamber 452 at an appropriate temperature at each of the points in the fabrication sequence. The system 450 may include a number of chambers 452 that are each configured to perform particular processes (e.g., a wet etch process, a dry etch process, and/or a deposition process, among others) during the fabrication sequence.

The system 450 may further include a controller 458. The controller 458 may include, or be associated with, circuitry and/or programming for implementation of, for instance, epitaxially growing a material on a storage node contact. The material may be grown to a size that seals the non-solid space adjacent the storage node contact. Adjustment of such deposition, removal, and etching operations by the controller 458 may control the critical dimensions (CDs) of the semiconductor devices created in the processing apparatus 451.

A host may be configured to generate instructions related to epitaxially growing a material on a storage node contact of the semiconductor device. The instructions may be sent via a host interface to the controller 458 of the processing apparatus 451. The instructions may be based at least in part on scaled preferences (e.g., in numerically and/or structurally defined gradients) stored by the host, provided via input from another storage system (not shown), and/or provided via input from a user (e.g., a human operator), among other possibilities. The controller 458 may be configured to enable input of the instructions and scaled preferences to define the CDs of the fabrication of the semiconductor device to be implemented by the processing apparatus 451.

The scaled preferences may determine final structures (e.g., the CDs) of passing sense lines, storage node contact, and epitaxially grown material. Particular CDs may be enabled by the particular scaled preferences that are input via the instructions. Receipt and implementation of the scaled preferences by the controller 458 may result in corresponding adjustment, by the processing apparatus 451, of a deposition time for the epitaxially grown material, adjustment of a coverage area, height, and/or volume of the epitaxially grown material, among implementation of other possible scaled preferences.

The controller 458 may, in a number of embodiments, be configured to use hardware as control circuitry. Such control circuitry may, for example, be an application specific integrated circuit (ASIC) with logic to control fabrication steps, via associated deposition and etch processes, for epitaxially growing a material on a storage node contact along with the removal of the epitaxially grown material from the storage node contact. The controller 458 may be configured to receive the instructions and direct performance of operations to perform epitaxial growth methods as described in connection with FIG. 3.

Figure 5:
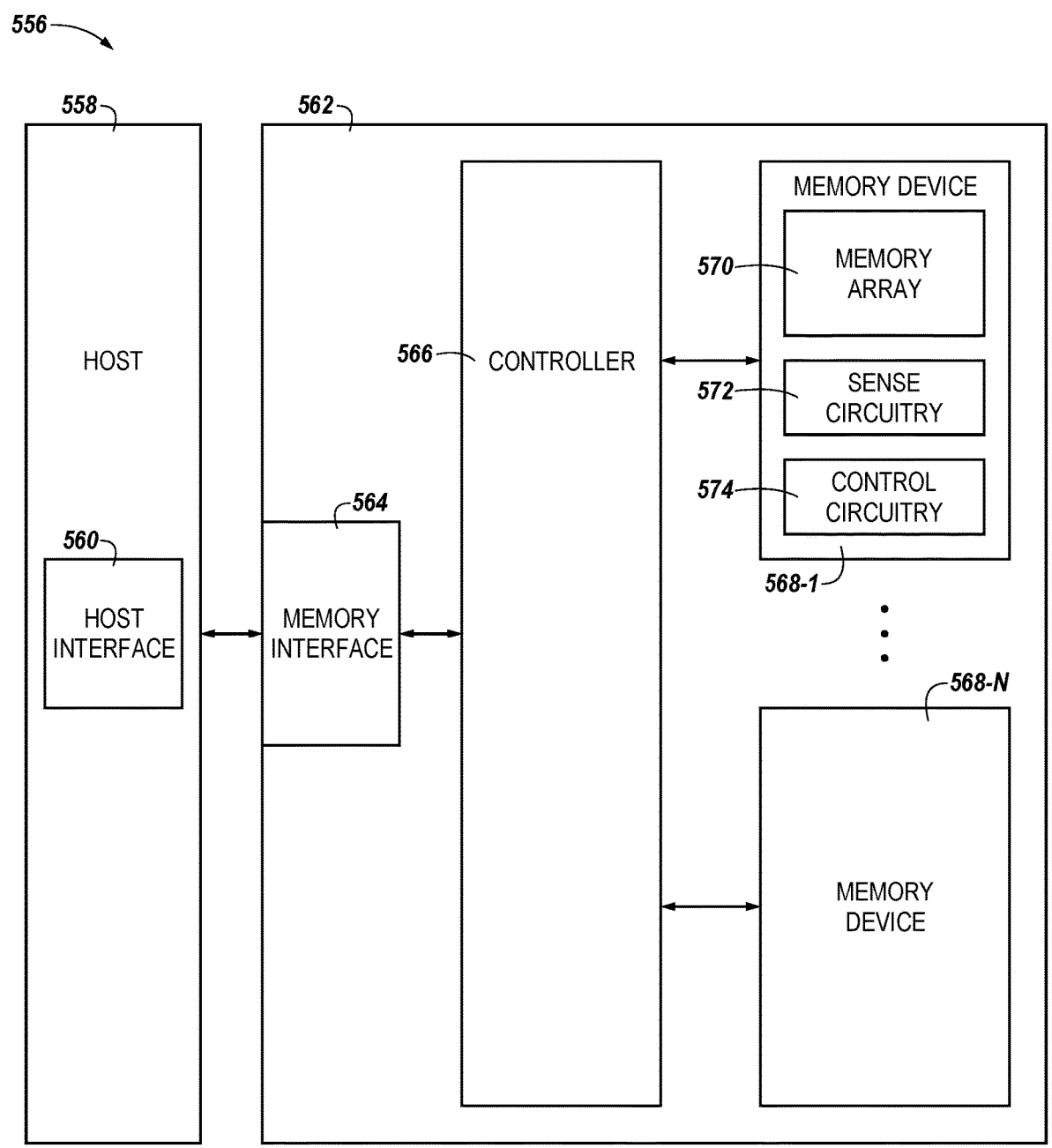
FIG. 5 is a functional block diagram of a computing system including at least one memory array having memory cells formed in accordance with a number of embodiments of the present disclosure.

FIG. 5 is a functional block diagram of a computing system 556 including at least one memory system 562 in accordance with one or more embodiments of the present disclosure. The numbering convention used in connection with FIG. 5 does not follow the earlier introduced numbering convention and sequence that applies to FIGS. 1-3. Memory system 562 may be, for example, a solid-state drive (SSD).

In the embodiment illustrated in FIG. 5, memory system 562 includes a memory interface 564, a number of memory devices 568-1, . . . , 568-N, and a controller 566 selectably coupled to the memory interface 564 and memory devices 568-1, . . . , 568-N. Memory interface 564 may be used to communicate information between memory system 562 and another device, such as a host 558. Host 558 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 558 may be associated with fabrication operations performed on semiconductor devices and/or SSDs using, for example, a processing apparatus shown at 551 and described in connection with FIG. 5.

In a number of embodiments, host 558 may be associated with (e.g., include or be coupled to) a host interface 560. The host interface 560 may enable input of scaled preferences (e.g., in numerically and/or structurally defined gradients) to define, for example, critical dimensions (CDs) of a final structure or intermediary structures of a memory device (e.g., as shown at 568) and/or an array of memory cells (e.g., as shown at 570) formed thereon to be implemented by the processing apparatus 551. The array includes access devices having epitaxially grown material formed according to embodiments described herein. The scaled preferences may be provided to the host interface 560 via input of a number of preferences stored by the host 558, input of preferences from another storage system (not shown), and/or input of preferences by a user (e.g., a human operator).

Memory interface 564 may be in the form of a standardized physical interface. For example, when memory system 562 is used for information (e.g., data) storage in computing system 556, memory interface 564 may be a serial advanced technology attachment (SATA) interface, a peripheral component interconnect express (PCIe) interface, or a universal serial bus (USB) interface, among other physical connectors and/or interfaces. In general, however, memory interface 564 may provide an interface for passing control, address, information, scaled preferences, and/or other signals between the controller 566 of memory system 562 and a host 558 (e.g., via host interface 560).

Controller 566 may include, for example, firmware and/or control circuitry (e.g., hardware). Controller 566 may be operably coupled to and/or included on the same physical device (e.g., a die) as one or more of the memory devices 568-1, . . . , 568-N. For example, controller 566 may be, or may include, an ASIC as hardware operably coupled to circuitry (e.g., a printed circuit board) including memory interface 564 and memory devices 568-1, . . . , 568-N. Alternatively, controller 566 may be included on a separate physical device that is communicatively coupled to the physical device (e.g., the die) that includes one or more of the memory devices 568-1, . . . , 568-N.

Controller 566 may communicate with memory devices 568-1, . . . , 568-N to direct operations to sense (e.g., read), program (e.g., write), and/or erase information, among other functions and/or operations for management of memory cells. Controller 566 may have circuitry that may include a number of integrated circuits and/or discrete components. In a number of embodiments, the circuitry in controller 566 may include control circuitry for controlling access across memory devices 568-1, . . . , 568-N and/or circuitry for providing a translation layer between host 558 and memory system 562.

Memory devices 568-1, . . . , 568-N may include, for example, a number of memory arrays 570 (e.g., arrays of volatile and/or non-volatile memory cells). For instance, memory devices 568-1, . . . , 568-N may include arrays of memory cells, such as a portion of an example memory device structured to include storage node contacts. At least one array includes an access device having a storage node contact formed according to the embodiments disclosed herein. As will be appreciated, the memory cells in the memory arrays 570 of memory devices 568-1, . . . , 568-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory device 568 may be formed on the same die. A memory device (e.g., memory device 568-1) may include one or more arrays 570 of memory cells formed on the die. A memory device may include sense circuitry 572 and control circuitry 574 associated with one or more arrays 570 formed on the die, or portions thereof. The sense circuitry 572 may be utilized to determine (sense) a particular data value (e.g., 0 or 1) that is stored at a particular memory cell in a row of an array 570. The control circuitry 574 may be utilized to direct the sense circuitry 572 to sense particular data values, in addition to directing storage, erasure, etc., of data values in response to a command from host 558 and/or host interface 560. The command may be sent directly to the control circuitry 574 via the memory interface 564 or to the control circuitry 574 via the controller 566.

The embodiment illustrated in FIG. 5 may include additional circuitry that is not illustrated so as not to obscure embodiments of the present disclosure. For example, memory device 568 may include address circuitry to latch address signals provided over I/O connectors through I/O circuitry. Address signals may be received and decoded by a row decoder and a column decoder to access a memory array 570. It will be appreciated that the number of address input connectors may depend on the density and/or architecture of memory devices 568 and/or memory arrays 570.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, openings, among other materials and/or components related to patterning a material over an active area for a storage node contact, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to patterning a material over an active area for a storage node contact than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus comprising:
   a working surface of a substrate material;
   a storage node contact connected to an active area of an access device on the working surface; and
   a material epitaxially grown over the storage node contact to enclose a non-solid space between the storage node contact and passing sense lines, wherein the epitaxially grown material is germanium (Ge).

2. The apparatus of claim 1, wherein the material is epitaxially grown to a width sealing the width of the non-solid space.

3. The apparatus of claim 1, wherein the storage node contact is formed from polysilicon.

4. The apparatus of claim 1, wherein a dielectric material is formed on sides of the storage node contact.

5. The apparatus of claim 4, wherein a height of the dielectric material formed on the sides of the storage node contact is less than a height of the storage node contact.

6. The apparatus of claim 1, wherein the material is epitaxially grown in multiple directions.

7. The apparatus of claim 1, wherein the material is epitaxially grown selectively on polysilicon.

8. The apparatus of claim 1, wherein the speed of the epitaxial growth of the material is controlled in situ.

9. The apparatus of claim 1, wherein the shape of the epitaxial growth of the material is controlled in situ.

10. A method comprising:
    forming a storage node contact on a working surface of a substrate material;
    forming passing sense lines adjacent to the storage node contact; and
    epitaxially growing silicon over the storage node contact to enclose a non-solid space between the storage node contact and the passing sense lines, wherein epitaxially growing the silicon over the storage node contact includes depositing etchant into the silicon in situ.

11. The method of claim 10, further comprising forming the etchant out of hydrogen chloride (HCl).

12. The method of claim 10, wherein epitaxially growing the silicon includes pseudo epitaxially growing silicon over a polysilicon storage node contact.

13. The method of claim 10, further comprising doping the epitaxial growth at a concentration up to $2 \times 10^{21}$ per square centimeter ($/cm^2$).

14. A system comprising:
    a working surface of a substrate material;
    a storage node contact;
    passing sense lines, wherein the storage node contact is formed to a height below a top portion of a metal portion of the passing sense lines;
    non-solid space separating the storage node contact and the passing sense lines; and
    silicon (Si) epitaxially grown over the storage node contact.

15. The system of claim 14, wherein the Si is epitaxially grown to a height above the top portion of the metal portion of the passing sense lines.

16. An apparatus comprising:
    a working surface of a substrate material;
    a storage node contact connected to an active area of an access device on the working surface, wherein the storage node contact is formed to a width in a range of 10-30 nanometers (nm); and
    a material epitaxially grown over the storage node contact to enclose a non-solid space between the storage node contact and passing sense lines, wherein:
        the non-solid space encompasses a width in a range of 30-50 Angstroms (Å); and
        wherein the material is epitaxially grown to a height in a range of 20-50 nanometers (nm).

17. A method comprising:
    forming a storage node contact on a working surface of a substrate material;
    forming passing sense lines adjacent to the storage node contact;
    epitaxially growing silicon over the storage node contact to enclose a non-solid space between the storage node contact and the passing sense lines; and
    adjusting a selectivity of the silicon by increasing or decreasing a flow of etchant in situ.

18. A method comprising:
    forming a storage node contact on a working surface of a substrate material;
    forming passing sense lines adjacent to the storage node contact;
    epitaxially growing silicon over the storage node contact to enclose a non-solid space between the storage node contact and the passing sense lines; and
    adjusting an amount of epitaxial growth by increasing or decreasing a flow of etchant in situ.

19. A method comprising:
    forming a storage node contact on a working surface of a substrate material;
    forming passing sense lines adjacent to the storage node contact epitaxially growing silicon over the storage node contact to enclose a non-solid space between the storage node contact and the passing sense lines; and
    adjusting a speed of epitaxial growth by increasing or decreasing a flow of etchant in situ.

20. A system comprising:
a working surface of a substrate material;
a storage node contact;
passing sense lines, wherein the storage node contact is formed to a height in a range of 20-25 nanometers (nm) above a top portion of a metal portion of the passing sense lines;
non-solid space separating the storage node contact and the passing sense lines; and
silicon (Si) epitaxially grown over the storage node contact.

\* \* \* \* \*